(12) United States Patent
Louchkoff et al.

(10) Patent No.: US 7,346,322 B2
(45) Date of Patent: Mar. 18, 2008

(54) RECEIVER INCLUDING LINEARITY COMPENSATION IN THE RECEIVE BAND

(75) Inventors: Marc Louchkoff, Aubagne (FR); Claude Rambault, Saint Sulpice la Foret (FR)

(73) Assignee: Thomson Licensing, Boulogne-Billancourt (FR)

( * ) Notice: Subject to any disclaimer, the term of this patent is extended or adjusted under 35 U.S.C. 154(b) by 452 days.

(21) Appl. No.: 10/945,841

(22) Filed: Sep. 21, 2004

(65) Prior Publication Data

US 2005/0066368 A1    Mar. 24, 2005

(30) Foreign Application Priority Data

Sep. 22, 2003   (FR) .................................. 03 11102

(51) Int. Cl.
*H04B 1/06* (2006.01)

(52) U.S. Cl. ............................. 455/232.1; 455/234.1; 455/307; 455/313

(58) Field of Classification Search ............ 455/232.1, 455/250.1, 234.1, 252.1, 248.1, 253.1, 236.1, 455/307, 313, 323, 333, 334
See application file for complete search history.

(56) References Cited

U.S. PATENT DOCUMENTS

| 4,059,803 | A | * | 11/1977 | Mikhailovsky | ............. | 455/330 |
| 4,464,636 | A | * | 8/1984 | Dobrovolny | ............. | 455/252.1 |
| 5,408,697 | A | * | 4/1995 | Price et al. | ............... | 455/248.1 |
| 5,530,405 | A | * | 6/1996 | Rydel | ......................... | 330/278 |
| 5,970,053 | A | * | 10/1999 | Schick et al. | ............... | 455/324 |
| 7,050,774 | B2 | * | 5/2006 | Tominaga | ................ | 455/241.1 |
| 2003/0176174 | A1 | * | 9/2003 | Seppinen et al. | ........ | 455/232.1 |

* cited by examiner

*Primary Examiner*—Lana N. Le
(74) *Attorney, Agent, or Firm*—Joseph J. Laks; Robert D. Shedd; Brian J. Cromarty

(57) ABSTRACT

The invention relates to a receiver 1 of signals and proposes to remedy a non-linearity problem in an amplifier 70 of an integrated tuner 7. A linearity compensation circuit 8 is inserted upline from the tuner 7. The compensation circuit 8 presents a characteristic that is the inverse of the characteristic of the low-noise amplifier 708 in order to compensate for the linearity defect.

5 Claims, 1 Drawing Sheet

RECEIVER INCLUDING LINEARITY COMPENSATION IN THE RECEIVE BAND

This application claims the benefit, under 35 U.S.C. 119, of France patent application No. 0311102 filed Sep. 22, 2003.

The invention relates to a receiver including linearity compensation in the receive band.

BACKGROUND OF THE INVENTION

The current state of the art allows for the use of integrated frequency tuners, in other words tuners produced as integrated circuits. A problem occurs with the use of integrated circuits, with tuners that include a low-noise amplifier and baseband transposition. The satellite intermediate frequency band is between 950 and 2150 MHz inclusive and low-noise amplifiers are known not to be linear throughout the intermediate frequency band. For conventional tuners in the form of discrete components, a compensation is possible in the frequency transposition circuit. Unfortunately, it is not possible to incorporate such compensation in an integrated circuit. Such an omission can cause a loss of signal in the transposition circuit under certain conditions of use.

BRIEF SUMMARY OF THE INVENTION

The invention proposes to remedy the above problem, by inserting upline from the tuner a linearity compensation circuit. The compensation circuit presents a characteristic that is the inverse of the characteristic of the low-noise amplifier to pre-compensate for the linearity defect.

The invention is an intermediate frequency band signal receiver, comprising an input terminal intended to receive a coaxial cable conveying signals in the intermediate frequency band, filtering and matching means passing signals with a frequency that lies within the intermediate frequency band, and providing impedance matching with the coaxial cable, a tuning circuit produced using an integrated circuit including a low-noise amplifier, the tuning circuit being linked to the filtering and matching means, and a compensation circuit placed on the link between the tuning circuit and the filtering means, said compensation circuit having a transfer characteristic that is the inverse of the transfer characteristic of the low-noise amplifier in the intermediate frequency band.

Preferentially, the compensation circuit is a dipole placed in parallel between the input of the tuning circuit and ground. The dipole comprises in series a resistor, an inductor and a capacitor. The inductor is produced using a microstrip line. The transfer characteristic of the compensation circuit provides a compensation greater than the transfer characteristic of the low-noise amplifier in the intermediate frequency band.

BRIEF SUMMARY OF THE DRAWINGS

The invention will be better understood, and other features and advantages will emerge, on reading the description that follows, with the description referring to the appended drawings in which.

DESCRIPTION OF PREFERRED EMBODIMENTS

Figure 1:
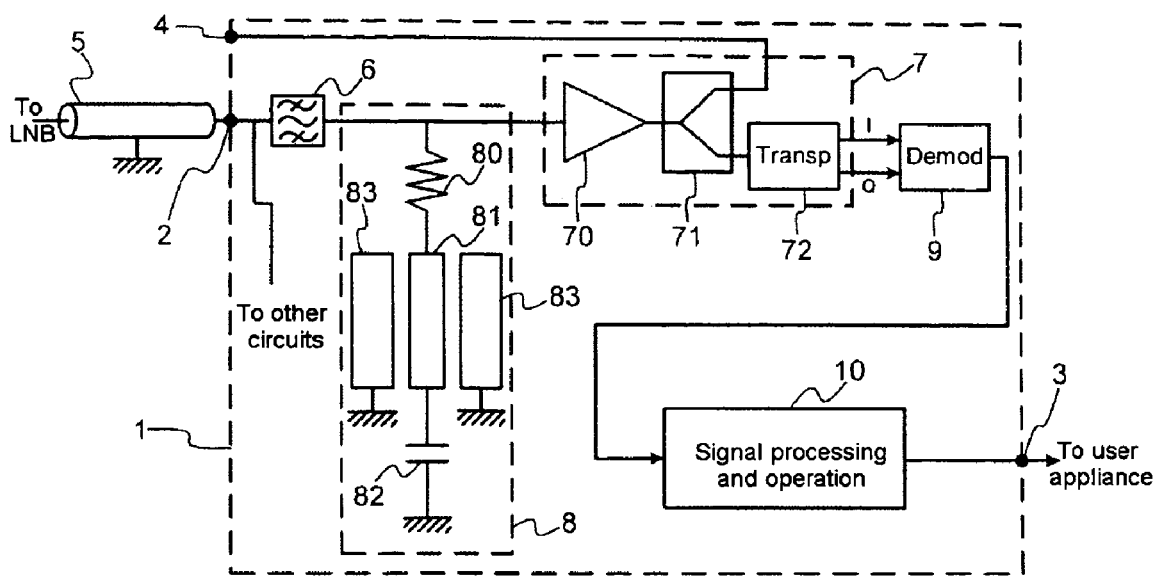
FIG. 1 represents a receiver according to the invention.

FIG. 1 represents a satellite receiver 1 which is, for example, a TV decoder, also known as a Set Top Box. In the example described, the receiver 1 comprises three terminals 2 to 4 for external connections, other terminals can be added according to the current state of the art. A first terminal 2 is used to connect a coaxial cable 5 to receive an antenna signal originating for example from the Low Noise Block (LNB) of a satellite antenna. A second terminal 3 is used to connect a user appliance, for example a TV, supplying it with an appropriate signal. A third terminal 4 is used to feed the antenna signal to another receiver placed in the installation.

The first terminal 2 is linked, inside the receiver 1, on the one hand to an input of a bandpass filter 6 and on the other hand to other circuits (not shown) used, for example, to provide a power supply voltage and send commands to the LNB and, where appropriate, to manage a satellite return channel. The bandpass filter 6 selects the satellite intermediate frequency band between 950 and 2150 MHz inclusive and feeds the filtered signal to an integrated tuner 7. The link between the filter 6 and the tuner 7 is via a compensation circuit 8.

The tuner 7 is an integrated circuit, such as the one marketed under the reference STV399 by STMicroelectronics or the one marketed under the reference TDA8262 by Philips. The tuner 7 comprises a low-noise amplifier 70 which amplifies the input signal and supplies it to a splitter 71 which distributes the signal to two outputs. A first output of the splitter 71 is linked to an output of the tuner 7 which is in turn linked to the third terminal 4. A second output of the splitter 71 feeds the amplified signal to a transposition circuit 72. The transposition circuit 72 transposes a channel from the intermediate frequency band to the baseband and supplies two signals I and Q to two outputs of the tuner. The transposition circuit 72 is not the subject of the present application, so it will not be described in more detail, and the professional can refer to the technical manuals for the aforementioned circuits.

A demodulation circuit 9 receives the signals I and Q, demodulates them, decodes them and feeds a bit stream representative of the transmitted data to an output. The demodulation circuit 9 is a circuit that is known in the prior art. A processing circuit 10 receives the bit stream originating from the demodulation circuit 9, converts it into a signal compatible with a user appliance and feeds the compatible signal to the second terminal 3.

Figure 2:
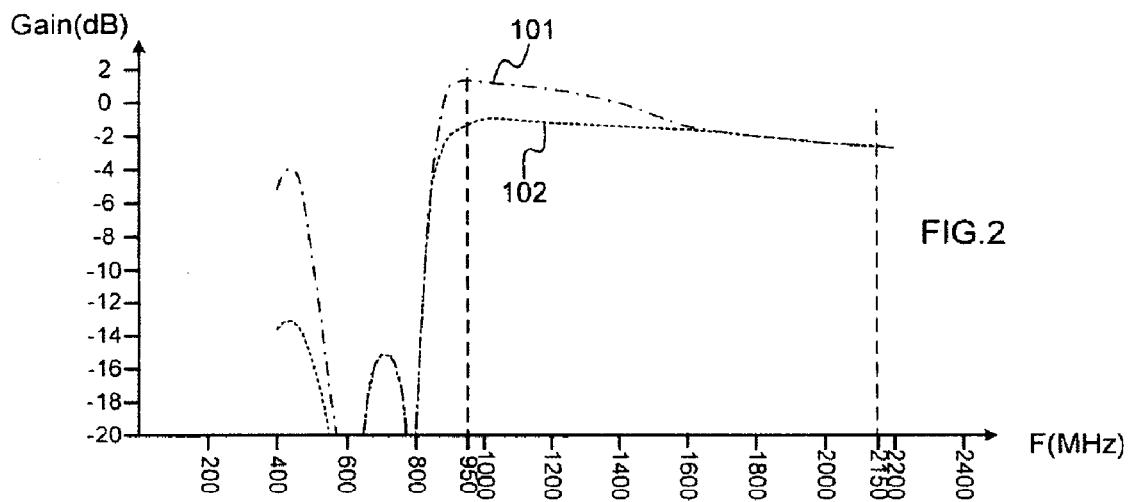
FIG. 2 represents the gain characteristic at the output of the signal amplified by the integrated tuner with and without correction.

Operation of the receiver 1 is generally known, apart from the compensation circuit 8. FIG. 2 shows two curves representing the signal transmission characteristics between the first terminal 2 and the third terminal 4. The curve 101 represents the gain between the two terminals 2 and 4 when the compensation circuit 8 is removed. This curve 101 shows that, in the intermediate frequency band, the gain variation is approximately 4 dB. The compensation circuit 8 is added to level off this transfer characteristic to obtain the curve 102 which shows no more than a variation of less than 2 dB in this intermediate frequency band.

The compensation circuit 8 has a transfer characteristic that is the inverse of that of the amplifier 70 to correct the transfer characteristic. In the example described, it was decided to produce the compensation circuit 8 using a dipole placed in parallel between the ground of the receiver 1 and the input of the tuner 7. The function of the dipole is to absorb a part of the signal which happens to be a nuisance while allowing the maximum of useful signal to pass without attenuating it. The dipole is, for example, an RLC type resonating cell, in other words comprising a resistor 80, an inductor 81 and a capacitor 82. In our example, the inductor 81 is a microstrip line of the coplanar type, in other words surrounded by a ground plane 83.

Figure 3:
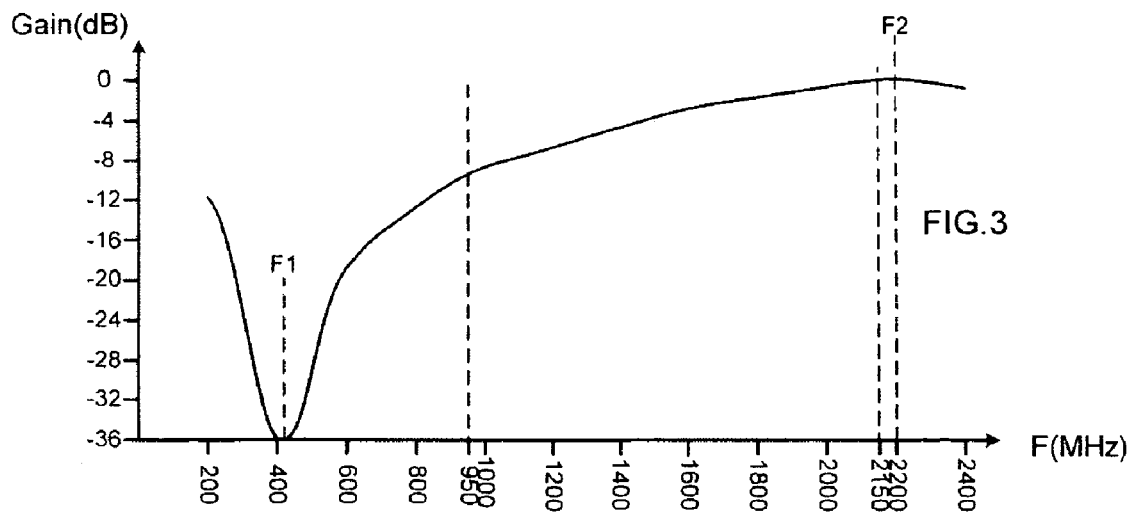
FIG. 3 represents the reflection characteristic of the dipole serving as the compensation circuit used in the embodiment described.

FIG. 3 shows the reflection coefficient of the wave in the dipole which is expressed as being equal to 20 log ($V_{incoming\ wave}/V_{reflected\ wave}$). This reflection coefficient is added to the curve 101 with a factor that depends on the impedance matching between the line and the dipole, the impedance of the dipole varying with frequency. In the example described, the components of the dipole are calculated as follows: the resistor is selected to be equal to the nominal impedance of the line linking the filter 6 and the tuner 7. The microstrip line 81 is designed to be equal to a quarter of the wavelength corresponding to the frequency F1, the frequency F1 corresponding to the minimum reflection of the dipole; the capacitor 82 is designed for the RLC cell to have a maximum reflection at the frequency F2, a little above the intermediate frequency band, typically 2200 MHz. To boost or reduce the coupling between the dipole and the line, that is to increase or reduce the effect produced by the dipole on the overall transfer characteristic, it is possible to vary the value of the resistor 80 away from the nominal line impedance value, this variation can be ±30% while retaining a good standing wave ratio.

By adjusting the dipole coupling, it is possible to have a transfer characteristic of the compensation circuit which provides a compensation greater than that needed to compensate for the transfer characteristic of the low-noise amplifier in the intermediate frequency band. This means that, in addition, losses due to the coaxial cable 5 when the cable is very long can also be compensated for.

As may be seen by those skilled in the art, the addition of the dipole also provides for stronger rejection of the frequencies located outside the intermediate frequency band, so improving the overall filtering characteristic.

Other variants of the invention are possible. It is possible to use an inductor of a type other than the microstrip line described in the preferred example. It is also possible to use a more conventional filtering device than a dipole, but this generates additional losses.

Again, the invention relates to a satellite receiver, but the same problem may arise less critically in the case of a receiver connected to a cable distribution network. The invention is not limited to satellite receivers.

What is claimed is:

1. A receiver of signals in an intermediate band comprising:
    an input terminal (2) intended to receive a coaxial cable conveying signals in the intermediate frequency band,
    filtering and matching means passing signals with a frequency that lies within the intermediate band and providing impedance matching with the coaxial cable,
    a tuning circuit produced using an integrated circuit including a low-noise amplifier, with a link between the tuning circuit and the filtering and matching means,
    wherein it further comprises a compensation circuit placed on the link between the tuning circuit and the filtering means, said compensation circuit having a transfer characteristic that is the inverse of the transfer characteristic of the low-noise amplifier in the intermediate frequency band.

2. A receiver according to claim 1, wherein the compensation circuit is a dipole placed in parallel between the input of the tuning circuit and ground.

3. A receiver according to claim 2, wherein the dipole comprises in series a resistor, an inductor and a capacitor.

4. A receiver according to claim 3, wherein the inductor is produced using a microstrip line.

5. A receiver according to claim 1, whereirn the transfer characteristic of the compensation circuit provides a compensation greater than the transfer characteristic of the low-noise amplifier, in the intermediate frequency band.

\* \* \* \* \*